United States Patent
Nagata et al.

(10) Patent No.: US 7,039,487 B2
(45) Date of Patent: May 2, 2006

(54) EXPOSURE APPARATUS AND EXPOSURE METHOD

(75) Inventors: Koji Nagata, Hachioji (JP); Haruo Yoda, Hinode (JP)

(73) Assignees: Hitachi, Ltd., Tokyo (JP); Hitachi High-Technologies Corporation, Tokyo (JP)

( * ) Notice: Subject to any disclaimer, the term of this patent is extended or adjusted under 35 U.S.C. 154(b) by 293 days.

(21) Appl. No.: 10/613,148

(22) Filed: Jul. 7, 2003

(65) Prior Publication Data

US 2004/0119029 A1    Jun. 24, 2004

(30) Foreign Application Priority Data

Dec. 18, 2002    (JP)    ............................. 2002-366201

(51) Int. Cl.
G06F 19/00 (2006.01)
G21K 5/10 (2006.01)
H01J 37/08 (2006.01)

(52) U.S. Cl. .................................. 700/121; 250/492.22
(58) Field of Classification Search ................ 700/121; 250/492.22

See application file for complete search history.

(56) References Cited

U.S. PATENT DOCUMENTS 4,482,810 A * 11/1984 Cooke ...................... 250/492.2
6,262,429 B1 * 7/2001 Rishton et al. ........ 250/492.23
6,271,852 B1 * 8/2001 Kamiyama et al. ......... 345/423
6,718,532 B1 * 4/2004 Inanami et al. ............... 716/19
2003/0026472 A1 * 2/2003 Abe .......................... 382/144

FOREIGN PATENT DOCUMENTS

JP    05-226235    9/1993
JP    10-154648    6/1998
JP    10-335206    12/1998

* cited by examiner

Primary Examiner—Leo Picard
Assistant Examiner—Ryan Jarrett
(74) Attorney, Agent, or Firm—Antonelli, Terry, Stout and Kraus, LLP.

(57) ABSTRACT

The present invention provides an exposure technology capable of generating bitmap data with high efficiency, and making compatible higher resolution and higher speed control in exposure using pattern data in a bitmap format. An apparatus implementing the exposure technology comprises: a means for applying a charged particle beam or a light onto a sample, and exposing a desired pattern onto the sample; a data processing means for bitmapping the shape of the pattern, and generating the pattern shape data in the bitmap format; and a means for controlling the application of the charged beam or light onto the sample using the pattern shape data in the bitmap format, and the data processing means comprising a function of rejecting an overlap area between patterns from pattern vertex data defining the pattern shape; and a function of generating the pattern shape data in the bitmap format based on the result of the overlap rejection function.

12 Claims, 16 Drawing Sheets

INVENTED METHOD

```
             CORNER POINT NAME
   DATA      (X COORDINATE, y COORDINATE, IDENTITY)
Pa1 (xa1, ya1, 1)
Pa2 (xa2, ya2, 2)       IDENTITY
Pb1 (xb1, yb1, 1)       1 : LOW-START
Pb2 (xb2, yb2, 2)       2 : LOW-END
Pb3 (xb3, yb3, 3)       3 : UPPER-START
Pa3 (xa3, ya3, 3)       4 : UPPER-END
Pa4 (xa4, ya4, 4)
Pb4 (xb4, yb4, 4)
```

| CORNER POINT IDENTITY CODE | OVERLAP NUMBER VARIATION | IDENTITY |
|---|---|---|
| 1 | +1 | LOW-START |
| 2 | −1 | LOW-END |
| 3 | −1 | UPPER-START |
| 4 | +1 | UPPER-END |

FIG. 8(a)

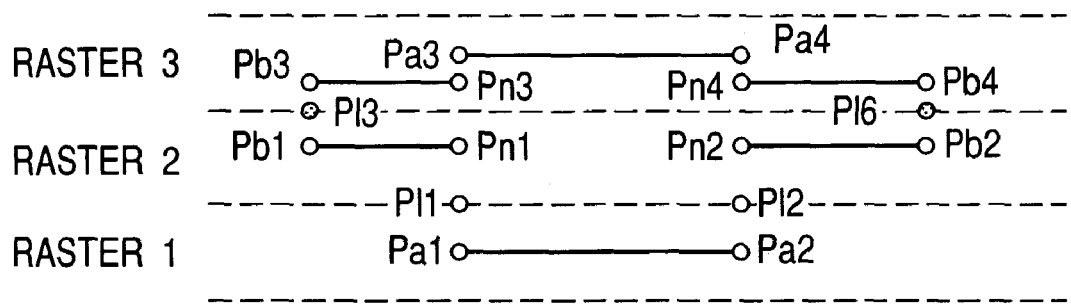

FIG. 8(b)

OUTPUT FROM OVERLAP REJECTION

Pa1 (x COORDINATE, y COORDINATE, IDENTITY)
Pa2 (x COORDINATE, y COORDINATE, IDENTITY)
Pb1 (x COORDINATE, y COORDINATE, IDENTITY)
Pn1 (x COORDINATE, y COORDINATE, IDENTITY)
Pl1 (x COORDINATE, y COORDINATE, IDENTITY)
Pl2 (x COORDINATE, y COORDINATE, IDENTITY)
Pn2 (x COORDINATE, y COORDINATE, IDENTITY)
Pb2 (x COORDINATE, y COORDINATE, IDENTITY)
Pb3 (x COORDINATE, y COORDINATE, IDENTITY)
Pl3 (x COORDINATE, y COORDINATE, IDENTITY)
Pn3 (x COORDINATE, y COORDINATE, IDENTITY)
Pa3 (x COORDINATE, y COORDINATE, IDENTITY)
Pa4 (x COORDINATE, y COORDINATE, IDENTITY)
Pn4 (x COORDINATE, y COORDINATE, IDENTITY)
Pb4 (x COORDINATE, y COORDINATE, IDENTITY)
Pl6 (x COORDINATE, y COORDINATE, IDENTITY)

FIG. 9

| LINE-CATEGORY | OVERLAP NUMBER | VALID (OUTPUT) | INVALID |
|---|---|---|---|
| UPPER | k = 0 | ○ | |
| UPPER | k ≠ 0 | | ○ |
| LOWER | k = 1 | ○ | |
| LOWER | k ≠ 1 | | ○ |

| CORNER POINT -IDENTITY | CALCULATION | CORNER POINT -IDENTITY | CALCULATION |
|---|---|---|---|
| 1 | ADD. | 4 | ADD. |
| 2 | SUB. | 5 | ADD. |
| 3 | SUB. | 6 | SUB. |

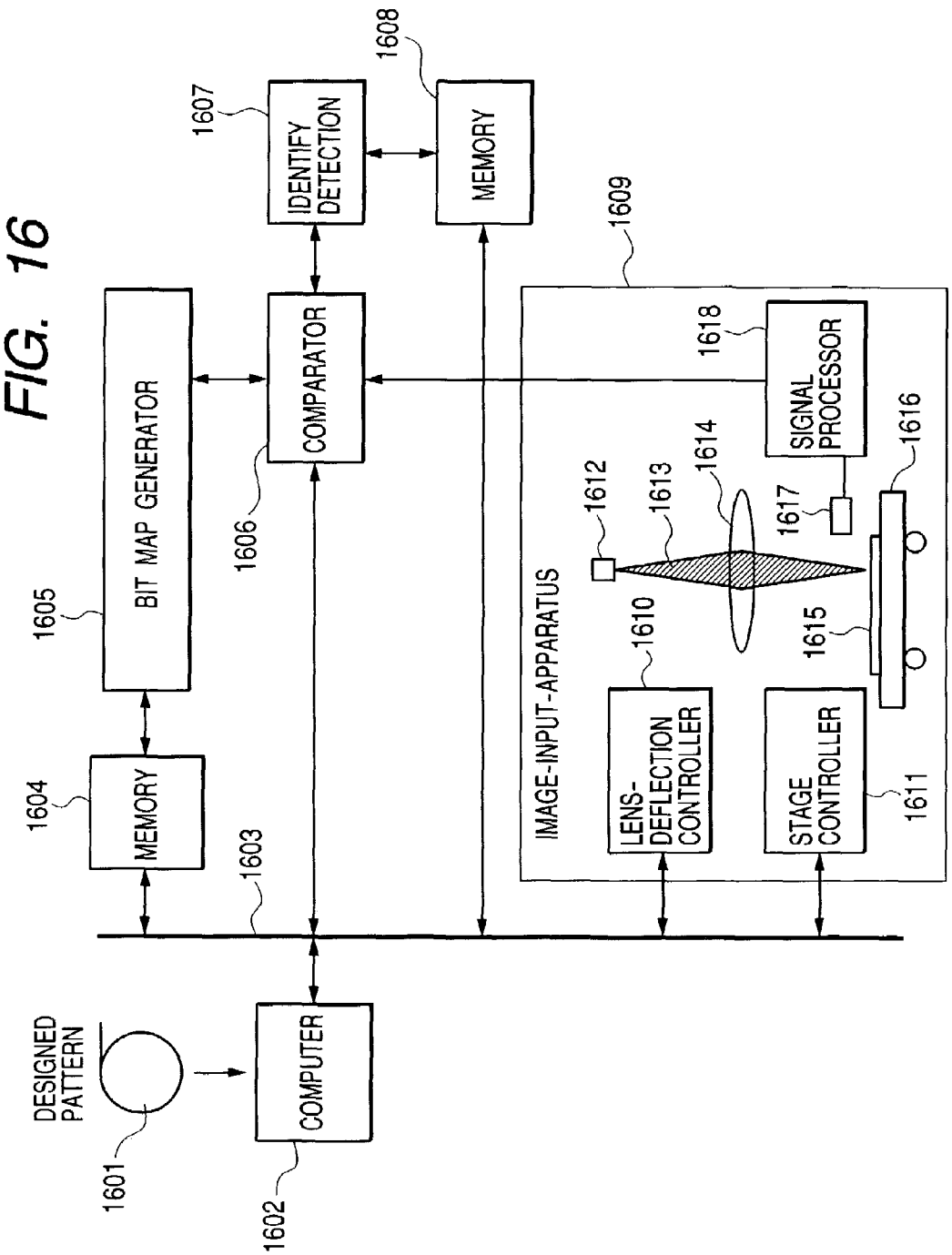

EXPOSURE APPARATUS AND EXPOSURE METHOD

BACKGROUND OF THE INVENTION

The present invention relates to an exposure technology. More specifically, it relates to an exposure apparatus and an exposure method each for controlling the application of a charged particle beam or a light on a sample using pattern shape data in a bitmap format, and exposing an LSI pattern, or the like.

Herein, a description will be given taking an exposure apparatus, particularly, an exposure apparatus using a charged particle beam as an example of the prior art.

FIG. 18 shows a general configuration of a charged particle beam lithography system for drawing an LSI pattern or the like (ex., see Sakitani et al.: "E-beam cell-projection lithography system", J. Vac. Sci. Technol. B, Vol. 10, No.6, November/December, 1992).

In the figure, a reference numeral 1801 denotes a charged beam housing; and 1802, a charged beam source, which generates a charged beam 1803. Reference numerals 1804, 1805, and 1806 denote a deflector/lens group, which converges and deflects the charged beam 1803. A sample 1807 on which a pattern is drawn is placed on a sample stage 1808. Further, the sample stage 1808 is position controlled by means of a sample stage control system 1811 including a laser length measuring instrument 1809. A reference numeral 1812 denotes a deflector/lens control system; 1813, a data control system; 1814, a control computer; and each of 1815, 1816, and 1817, a deflector/lens driver circuit. A pattern data to be drawn is inputted from the control computer 1814, and processed at the data control system 1813. Based on the result, the deflector/lens control system 1812 drives the deflector/lens group 1804, 1805, and 1806 via the deflector/lens driver circuits 1815, 1816, and 1817, and converges and deflects the charged beam 1803 to carry out drawing on the sample 1807.

FIG. 1 shows a prior-art data processing process in a charged particle beam lithography system for controlling the application of a charged particle beam on a sample using pattern shape data in a bitmap format, and drawing an LSI pattern or the like (see, ex., Abboud et al.: "Electron beam lithography using MEBES IV", J. Vac. Sci. Technol. B, Vol. 10, No. 6, November/December, 1992).

In the figure, a data processing unit 101 is composed of a data grouping/line up unit 102, a pattern decomposition unit 103, a quantization unit 104, and a field memory unit 105. A pattern 106 to be inputted to the data processing unit 101 is configured as an aggregate of basic patterns defined by basic pattern commands indicative of rectangles or oblique patterns.

For example, as shown in FIG. 1, the inputted patterns are first classified into groups respectively present inside the areas allowing exposure thereon by beam deflection (deflection areas 1 to 4) at the data grouping/line-up unit 102. Further, the deflection areas are arrayed on a per grouped data basis according to the exposure sequence. Then, the arrayed data are sequentially inputted according to the sequence in which they are arrayed into the pattern decomposition unit 103. Each pattern in each deflection area is further divided into minute rectangles 107 from the basic pattern defined by a basic pattern command. This processing is generally performed on an oblique pattern. By this, every pattern is converted into the format adopting the rectangle 107 as the fundamental unit.

Then, the respective divided rectangles 107 are sequentially inputted to the quantization unit 104, and each size and each coordinates in the deflection area are respectively quantized to the integral multiple of the size of a pixel 108 constituting a bitmap. Then, a processing for assigning value 1 to each pixel included in each rectangle inside area, and value 0 to each pixel included in the outside area is performed to obtain the bitmap for each rectangle. In actuality, to the field memory unit 105 having two dimensional addresses corresponding to the deflection areas, writing is sequentially performed on a per rectangle basis by determining the addresses with reference to the coordinates and the size of each quantized rectangle. By sequentially writing the quantized rectangle data on the field memory, the overlap between patterns is automatically rejected.

By repeatedly performing a series of the processing steps, it is possible to obtain pattern data in the bitmap format for each deflection area on the field memory. The bitmap data obtained are sequentially read in synchronism with deflection control, and supplied for exposure operation control such as blanking control.

The problems encountered during the foregoing prior-art data processing operation are that large bitmap data developed on a per deflection area basis are required to be handled in a high-speed data processing system, and that a large scale memory area for holding the data becomes necessary.

In recent years, the size resolution required of a lithography apparatus has been increasingly becoming smaller. In the prior art bitmap data, the values which the pixels have are simple binary, and hence the pixel size and the size resolution of the lithography system are in a one-to-one relationship to each other. Therefore, in order to make finer the size resolution of the lithography system according to the request, it is necessary to reduce the pixel size of the bitmap itself. As a result, the bitmap data to be developed and held are increasingly becoming larger, resulting in a bottleneck against the high-speed performances of data processing and blanking control. In addition, the memory area further increases in scale, resulting in an increase in scale of the system.

SUMMARY OF THE INVENTION

The present invention has been completed in view of the foregoing problems. It is therefore an object of the present invention to provide an exposure technology capable of making compatible high resolution and high speed control in exposure using pattern data in a bitmap format.

In order to achieve the foregoing object, in the present invention, it is so configured that the bitmap data of the portion to be exposed are sequentially generated in real time for exposure. As a result, the amount of data to be handled inside the data processor is largely reduced, which enables the increase in speed of processing and the reduction in circuit scale.

Further, each pixel data of the bitmap is made multi-level so that fine exposure size resolution can be obtained with a pixel size larger-than it. This allows higher resolution and high speed control to be compatible with each other.

Below, typical configuration examples of the present invention will be shown.

(1) An exposure apparatus of the present invention comprises: a means for applying a charged particle beam or a light onto a sample, and exposing a desired pattern onto the sample; a data processing means for bitmapping the shape of the pattern, and generating the pattern shape data in a bitmap format; and a means for controlling the application of the charged beam or light onto the sample using the pattern shape data in the bitmap format, and the data processing means comprising a function of rejecting an overlap area between patterns from pattern vertex data defining the pattern shape; and a function of generating the pattern shape data in the bitmap format based on the result of the overlap rejection function.

(2) An exposure apparatus of the present invention, comprises: a means for applying a charged particle beam or a light onto a sample, and exposing a desired pattern onto the sample; a data processing means for bitmapping the shape of the pattern, and generating the pattern shape data in a bitmap format; and a means for controlling the application of the charged particle beam or light onto the sample using the pattern shape data in the bitmap format, and the data processing means comprising a function of decomposing the pattern shape into a plurality of rectangle patterns parallel to any one coordinate axis of the orthogonal coordinates defined on the sample, and converting each rectangle pattern into the data format for expressing the pattern shape by a pair of opposite corner point coordinates of each side parallel to any one coordinate axis of the orthogonal coordinates defined on the sample; a function of grouping corner point data representing the respective rectangle patterns on a per given coordinate area basis, and sorting the respective grouped corner point data by reference to the coordinates of the respective corner point data; a function of rejecting an overlap area between patterns from the respective sorted corner point data; and a function of generating the pattern shape data in the bitmap format based on the result of the overlap rejection function.

(3) An exposure method of the present invention, comprises the steps of: controlling the application of a charged particle beam or a light on a sample using pattern shape data in a bitmap format, and exposing a desired pattern onto the sample; and in addition, decomposing the pattern shape into a plurality of rectangle patterns parallel to any one coordinate axis of the orthogonal axes defined on the sample, and converting rectangle pattern into the data format for expressing the pattern shape by a pair of opposite corner point coordinates of each line parallel to any one coordinate axis of the orthogonal coordinates defined on the sample; grouping corner point data representing the respective rectangle patterns on a per given coordinate area basis, and sorting the respective grouped corner point data by reference to the coordinates of the respective corner point data; and rejecting an overlap area between patterns from the respective sorted corner point data, wherein the pattern shape data in the bitmap format is generated based on the result of the overlap rejection step.

BRIEF DESCRIPTION OF THE DRAWINGS

FIGS. 8(a) and 8(b) are diagrams for illustrating the extraction results of the pattern outermost periphery in the example of the present invention;

FIG. 9 is a diagram for illustrating the determination of valid or invalid of the corner point processing in the example of the present invention;

FIG. 16 is a diagram for illustrating one configuration example in which the present invention has been applied to a comparison test apparatus;

DETAILED DESCRIPTION OF THE PREFERRED EMBODIMENTS

Below, examples of the present invention will be described by reference to the accompanying drawings.

Figure 1:
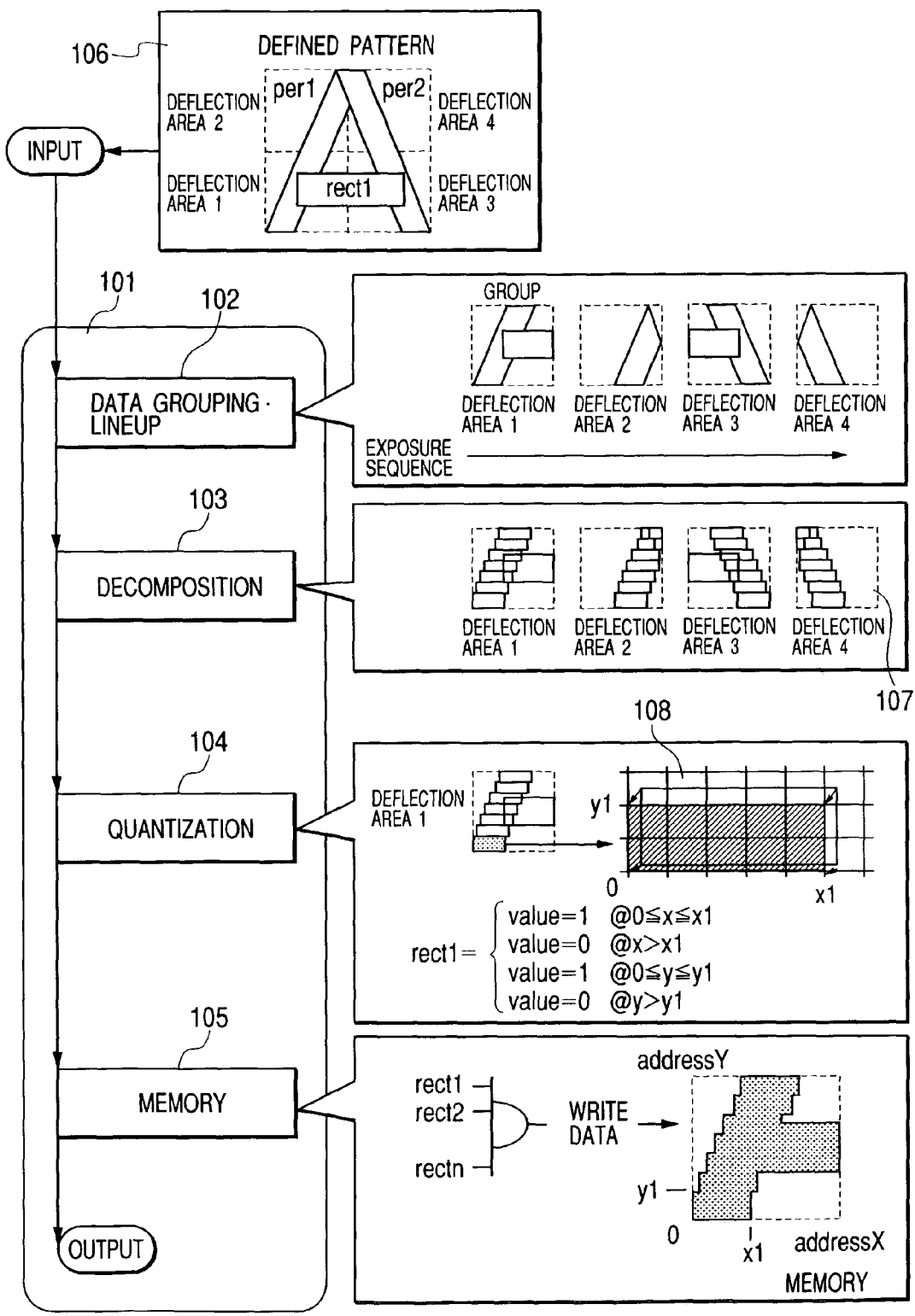
FIG. 1 is a diagram for illustrating a conventional data processing method.
Figure 2:
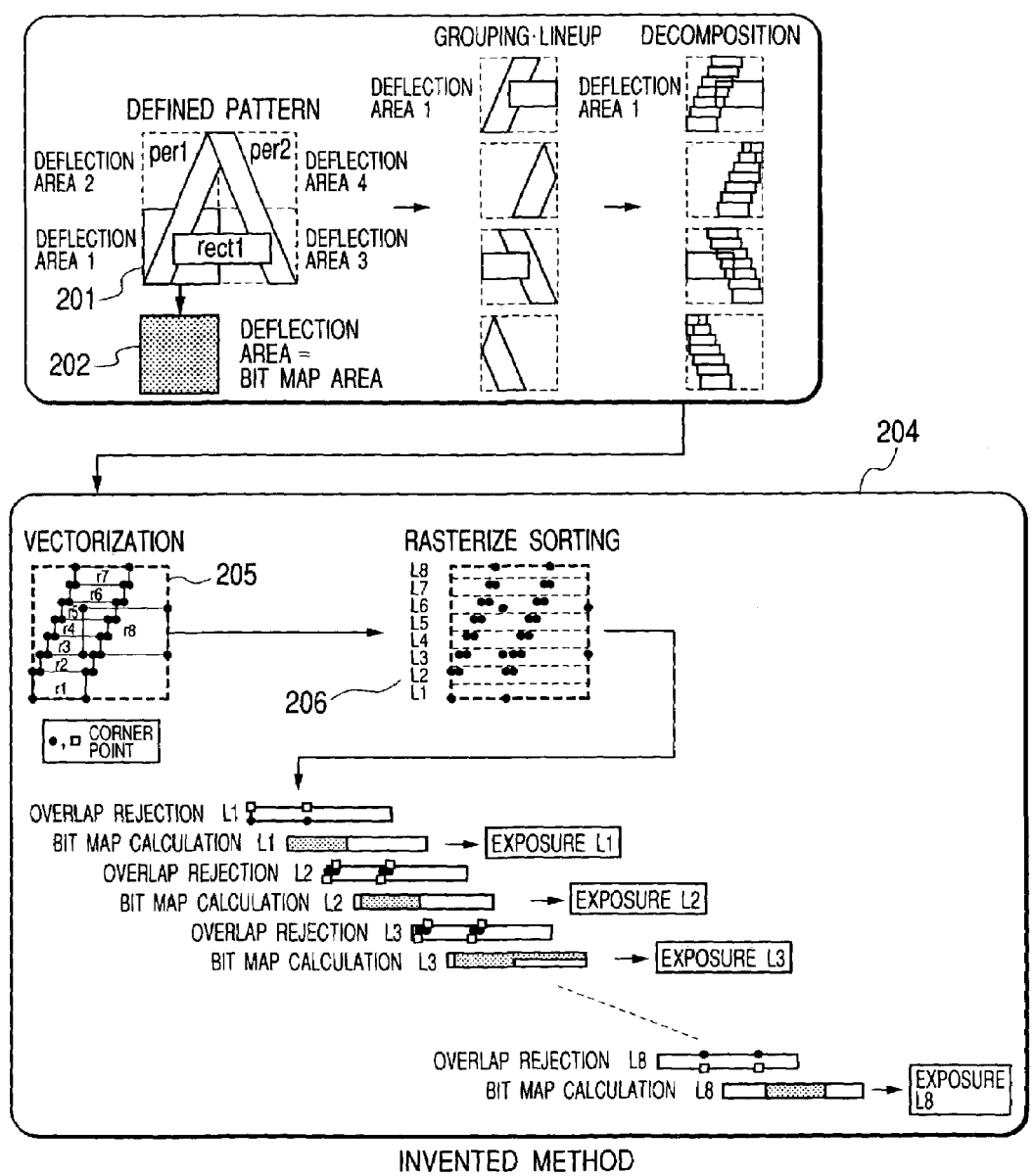
FIG. 2 is a diagram for illustrating a basic configuration of a data processing method of the present invention.

FIG. 2 shows a basic configuration of data processing in an exposure apparatus in accordance with the present invention. The data inputted as with the prior art are subjected to grouping/line-up on a per deflection area basis, and rectangle decomposition as shown in the figure. A deflection area 201 and a matrix area 202 forming a bitmap area agree with each other as shown in the figure.

In the foregoing prior art, pattern processing is accomplished by the method in which quantization and field memory writing processing are sequentially carried out in units of rectangles present in the bitmap area. Therefore, in order to obtain the bitmap of the whole area, a large memory area allowing the whole area to be developed therein becomes necessary. The developed bitmaps are stored and held therein. By sequentially reading the bitmaps, exposure is carried out.

In contrast, with the method indicated by a reference numeral 204 of the present invention, vectorization 205 is carried out in which respective rectangles after decomposition processing are converted to the format for expressing the pattern shape by the opposite corner points of each line constituting the rectangle. After the vectorization, respective corner point data are rasterized into their respective row areas (L1 to L8) 206 of the matrix forming the bitmap area, followed by data sorting processing. Thus, overlap rejection and bitmap calculation processings are performed parallelly in a pipeline manner by the data of each row area. With this method, the bitmap data are sequentially calculated on a per the row area basis, and hence can be readily used for exposure. This eliminates the necessity to store and hold the whole bitmap, and hence it is possible to reduce the amount of data to be held in the inside, which allows the increase in speed of processing and the reduction in scale of the apparatus.

Below, the configuration of a data processing unit of the present invention, and details of processing steps will be described.

Figure 3:
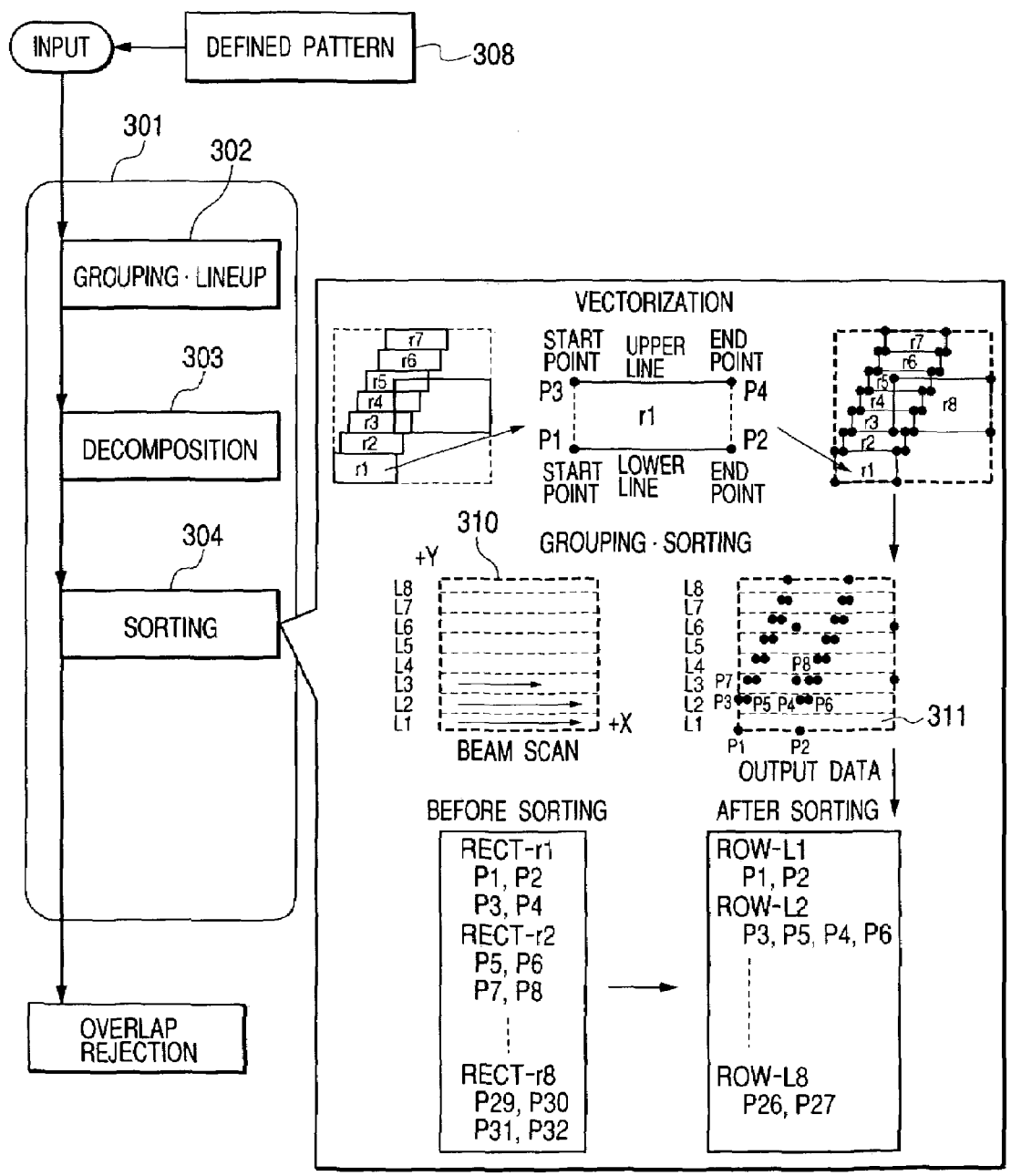
FIG. 3 is a diagram for illustrating a configuration (1) of one example of the data processing method of the present invention.
Figure 4:
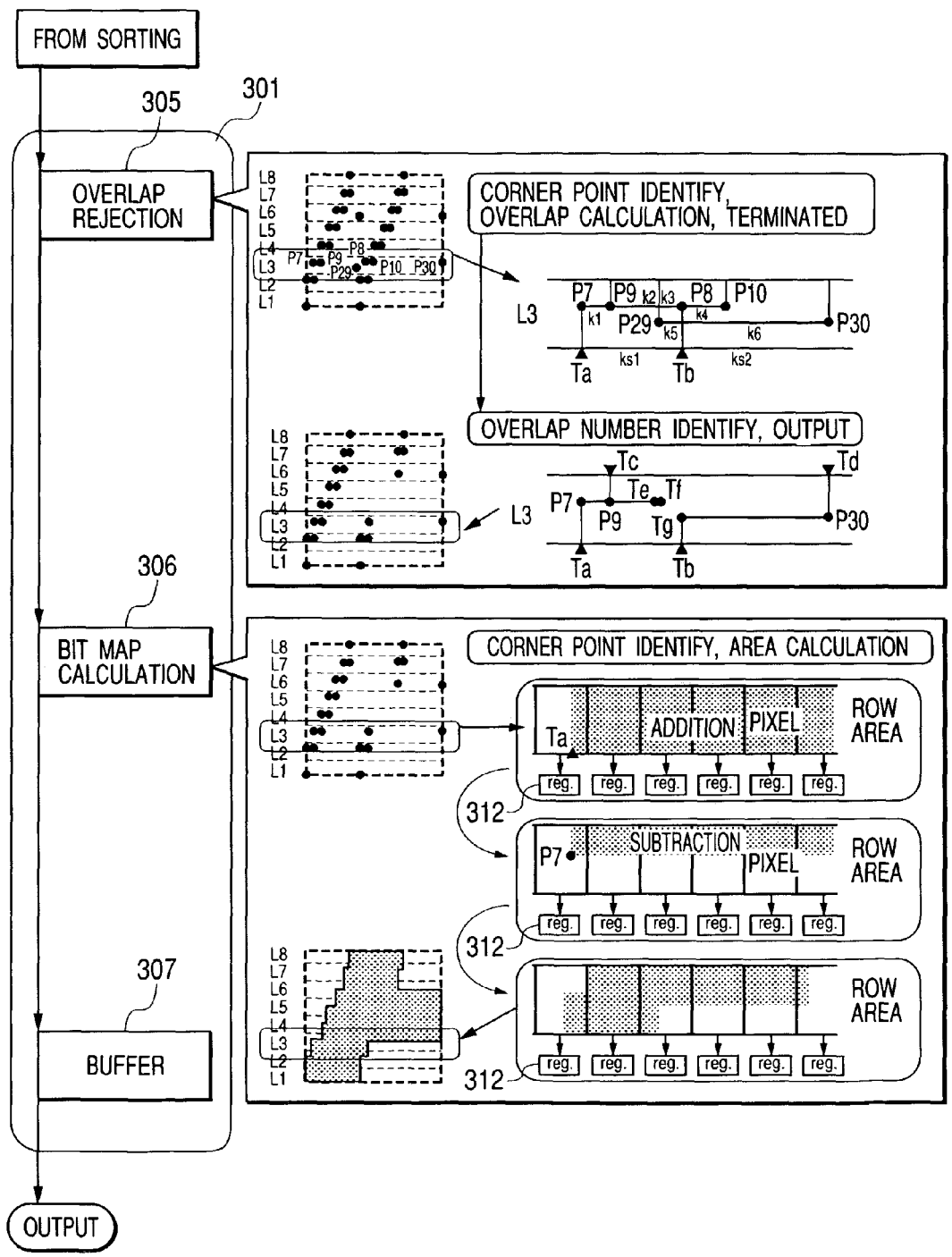
FIG. 4 is a diagram for illustrating a configuration (2) of one example of the data processing method of the present invention.

FIGS. 3 and 4 show one example of a configuration of a data processing unit 301 in accordance with the present invention. The data processing unit 301 in accordance with the present invention is composed of a data grouping/line-up unit 302, a pattern decomposition unit 303, a data sorting unit 304, an overlap rejection unit 305, a bitmap calculation unit 306, and a buffer unit 307. Below, as shown in the figures, a description will be given using the same patterns as those described for the prior art.

A pattern 308 to be inputted to the data processing unit 301 is configured as an aggregate of basic patterns defined by basic pattern commands indicative of rectangles or oblique patterns. The inputted patterns 308 are first classified into groups respectively present inside their corresponding deflection areas at the data grouping/line-up unit 302. Further, the deflection areas are arrayed on a per grouped data basis according to the exposure sequence.

Then, the arrayed data are sequentially inputted according to the sequence in which they are arrayed into the pattern decomposition unit 303. Each pattern in each deflection area is further divided into minute rectangles 309 from the basic pattern defined by a basic pattern command. This processing is generally performed on an oblique pattern. By this, every pattern is converted into the format adopting the rectangle 309 as the fundamental unit.

Up to this point, the same processing as in the prior art have been adopted. However, at the data processing unit 301 in accordance with the present invention, all the rectangles after decomposition processing are inputted to the data sorting unit 304. Inside the data sorting unit 304, the rectangle data is converted into the vectorized data format expressed as the pair of opposite corner points of each line parallel to any one coordinate axis of the orthogonal coordinates defined on a sample. Simultaneously, to the each corner point data describing the converted rectangle data, identity data indicating to which of the upper line and the lower line, between which the vertical relationship is defined by the values of the coordinate orthogonal to the coordinate axis, it belongs, or indicating which of the start point and the end point of the line it is, is appended.

Then, the corner point data are sorted in the sequence corresponding to the exposure sequence inside the exposure area by reference to the coordinate values. Herein, a description will be given by taking the case where the matrix forming the bitmap area to be exposed by beam deflection and a beam deflection control 310 satisfy the relationship as shown in the figure as an example. The beam deflection control 310 scans in each row area 311 of the matrix forming the bitmap area in ascending order of X coordinate, and sequentially moves in the row area 311 in ascending order of Y coordinate. In response to the beam deflection control 310, the corner point data are grouped into their respective row areas 311 of the matrix forming the bitmap area according to the coordinate values, and further, sorted in ascending order of X coordinate in the inside thereof. Then, sorting is performed on a per row area 311 basis of the matrix forming the bitmap area in ascending order of Y coordinate of the area. In other words, the sequence of beam deflection and the coordinate sequence for sorting the corner point data generally agree with each other. After performing the sorting processing, the corner point data are sequentially inputted to an overlap rejection unit 305 in the sorted order.

The foregoing overlap between the patterns in the prior art has been automatically rejected by sequentially performing writing to the field memory based on the rectangle data quantized by the bitmap-constituting pixels. This method is a simple method allowing the rejection of the overlap between patterns without any particular processing. However, this method requires a two-dimensional large capacity field memory for developing therein the bitmap data, so that address control for controlling the large capacity memory becomes a bottleneck in high speed capability.

Under such circumstances, in the present invention, in order to generate the bitmap of the exposure portion in real time, and to reduce the amount of data to be handled, the procedure is adopted wherein the overlap between patterns is directly rejected using corner point data, and then the bitmap calculation is performed.

FIG. 4 shows the processing step at the overlap rejection unit 305 and the subsequent processing steps of the present invention. The foregoing corner point data subjected to sorting processing are sequentially inputted to the overlap rejection unit 305 in the sorted order. Herein, the processing of an L3 area will be described as an example. In the L3 area, corner point data are arrayed in the order of P7, P9, P29, P8, P10, and P30. Whereas, the initial values of the overlap number are set at ks1 and ks2 with points Ta and Tb as the boundaries on the lower boundary line of the L3 area from the results of processing on the L2 area performed prior to the processing on the L3 area. The respective corner point data are inputted according to the sequence of array to the overlap rejection unit 305. The identity data for determining the upper line, the lower line, the start point, and the end point are appended to respective corner point data. Therefore, at the overlap rejection unit 305, by reference to the data, addition and subtraction calculations of the overlap numbers (k1 to k6) of respective line segments with the read corner point data as the boundaries are performed. In this calculation, the initial values of the overlap number ks1 and ks2 are reflected. The read corner point data are held inside until the pair of the start point and the end point is established. Then, it is identified whether the data are valid data or not by reference to the overlap variables of the corner point data of the start point upon the establishment of the start point/end point pair. When the data have been determined as valid, the both corner point data are inputted to the subsequent bitmap calculation unit 306. Simultaneously therewith, the held corner point data are deleted. Further, during this calculation processing, the generation of the overlap number initial values (Tc, Td) on the subsequent processing area, on the lower boundary line of L4 for this example is also carried out. The results of the foregoing processing are, as shown in the figure, corner points Ta, P7, P9, Tc, Te, Tf, Tb, Tg, P30, and Td. The foregoing processing is repeatedly performed for each of the subsequent areas.

Then, the processing steps of the bitmap calculation unit 306 will be described. Upon receiving data from the overlap rejection unit 305, for respective corner point data, the bitmap calculation unit 306 calculates how large proportion of the area of the rectangle region formed by the corner points as the vertexes inside the row area of the matrix forming the bitmap area to which the corner points belong, is included in the respective pixels in the row area of the matrix. For example, when the corner point data Ta of the calculation result is inputted, it is calculated how large proportion of the area of the rectangle having Ta as a vertex is included in the respective pixels inside the row area of the matrix forming the bitmap area. The calculated values of the areas respectively included in their corresponding pixels are recorded in their respective area calculation registers 312 provided corresponding to respective pixels. At this step, the sign for calculating the area is determined by reference to the identity data of the inputted corner point data. For example, for the corner point data Ta, the calculated area value is added to the value held by the area calculation register 312. Whereas, for the corner point data P7, the area inside the respective pixels obtainable from the rectangle generated by P7 is subtracted.

By repeatedly performing the foregoing processing on the overlap rejection output, it is possible to finally obtain a bitmap corresponding to the desired pattern shape. All the corner point data for one row area of the matrix forming the bitmap area, or a partial area thereof are processed, and respective values in the area calculation registers are outputted to the buffer unit 307. Simultaneously, the respective values in the area calculation registers 312 are cleared, and the process goes to the bitmap calculation processing in the row area of the next matrix or a partial area thereof. The bitmap data inputted to the buffer unit 307 are sequentially read and given to the exposure control in synchronism with execution of the beam deflection of the row area to which the data belong.

A description will be given to the case where the pattern as shown in FIG. 5(*a*) is processed by the overlap rejection unit and the bitmap calculation unit in the data processing unit of the present invention having the configuration described above.

Figure 13:
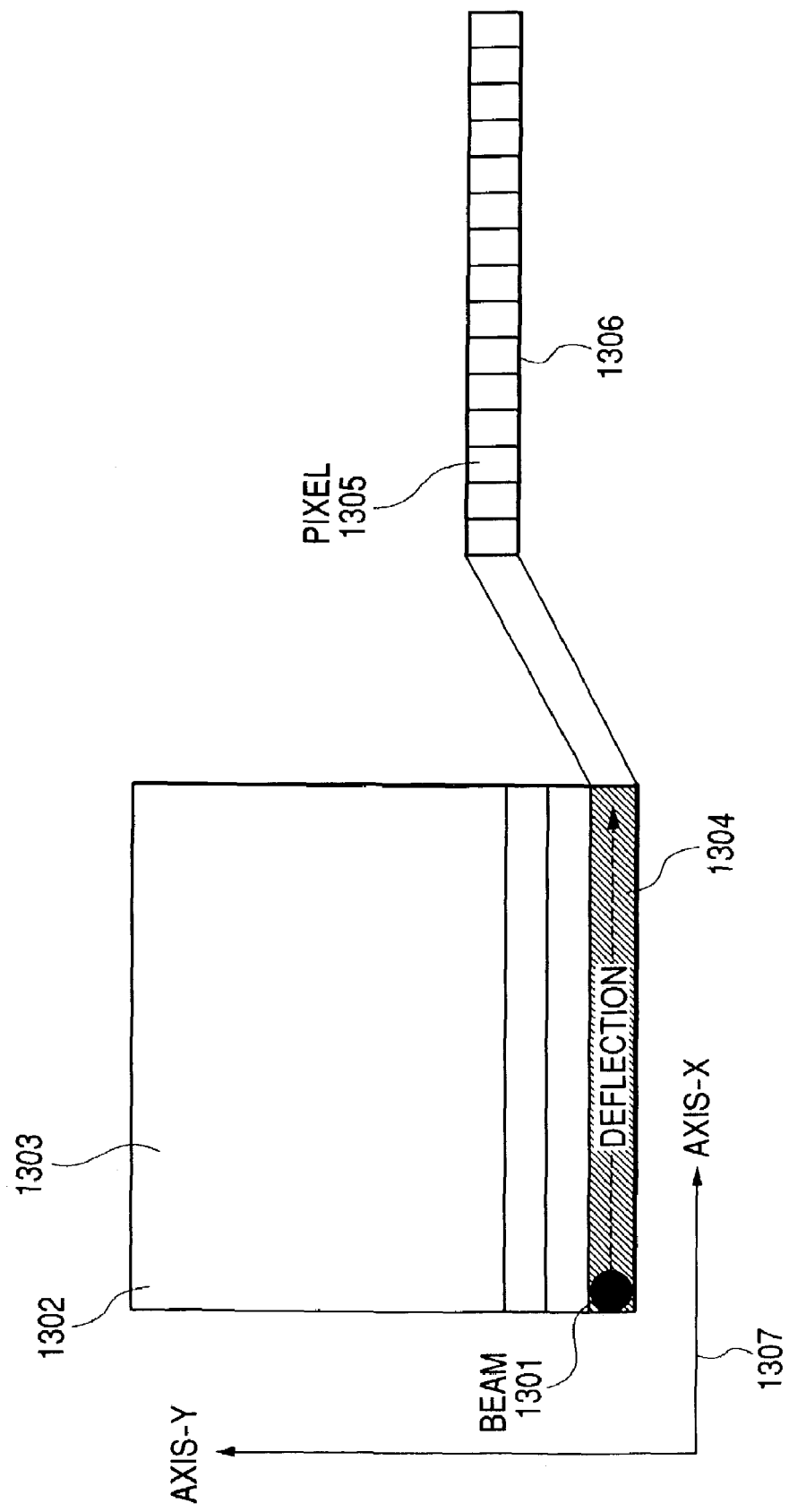
FIG. 13 is a diagram for illustrating the relationship between a beam deflection area and a bitmap matrix area, and the relationship between deflection control and a raster area in the example of the present invention.

The relationship between the beam deflection area and the bitmap matrix area forming the bitmap area, and the relationship between the deflection control and a raster area 1306 which is the array of pixels 1305 are set as shown in FIG. 13. It is so configured that the deflection area 1302 which is the area allowing deflection and positioning of a beam 1301 therein and the bitmap matrix area 1303 for bitmapping the pattern agree with each other. Further, an area 1304 to be exposed every time the beam 1301 is deflection controlled and the raster area 1306 which is the array of the bitmap pixels 1305 agree with each other. Whereas, the relationship with a pattern defining coordinate system 1307 is also as shown in the figure.

The pattern of FIG. 5(*a*) is so configured that two rectangles A501 and B502 overlap one another to form a pattern in the shape of a cross. Further, the respective rectangles are defined as lying over some of the row areas (herein, these areas are referred to as rasters, and respectively numbered 1 to 3, in sequence) of the matrix forming the bitmap area. The input data corresponding to the pattern are, as described above, grouped raster by raster, and have undergone the steps up to data sorting in ascending order of X coordinate inside each raster, and in ascending order of Y coordinate for every raster. This results in the corner point data string as shown in FIG. 5(*b*). In actuality, when sorting data is determined, the data is sent out to the overlap rejection unit, whenever necessary. Then, the overlap rejection unit performs the processing thereof.

Figures 5A, 5B, 6:
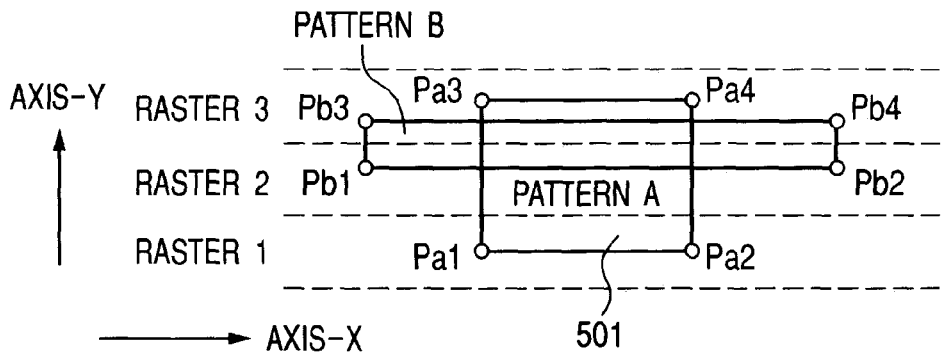
FIGS. 5(a) and 5(b) are diagrams for illustrating the processing of a pattern in the example of the present invention.
FIG. 6 is a diagram for illustrating the relationship between the corner point identity and the overlap number (k) in the example of the present invention.

The overlap rejection unit sequentially reads and processes the corner point data sorted, and sent out whenever necessary. The overlap number k of the line generated from the read corner point varies in accordance with the identity of the corner point data with the overlap number on the lower side than the read corner point as the initial value. In this example, the variations of the corner point identity and the overlap number k are specified as shown in FIG. 6. Further, the lower boundary line and the upper boundary line of each raster area are set to be the lower limit and the upper limit, respectively, and the overlap numbers thereof are also defined. In the initial state, the overlap number of the lower limit boundary line of the first raster is 0.

Figure 7:
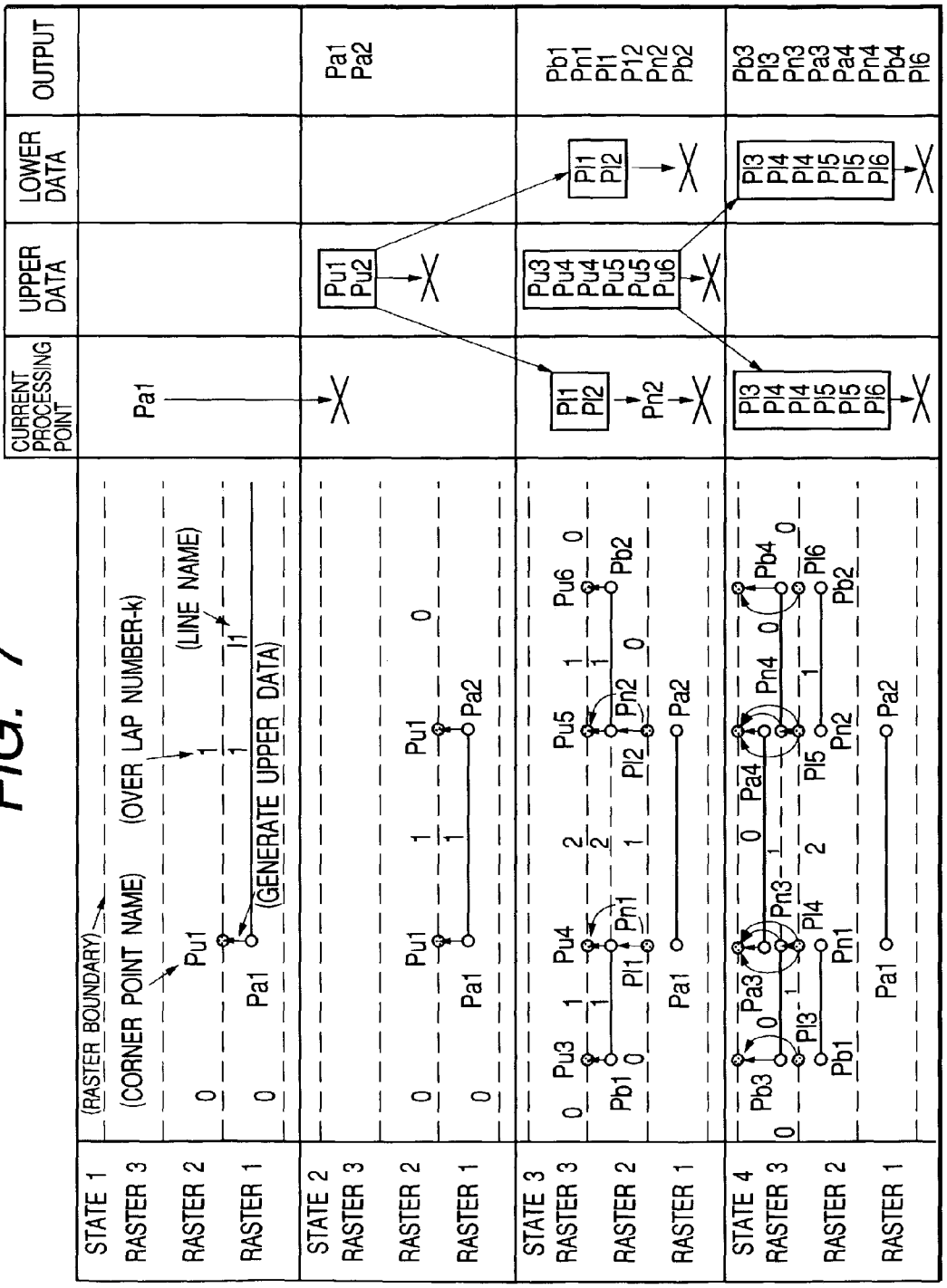
FIG. 7 is a diagram for illustrating the processing of an overlap rejection unit in the example of the present invention.

FIG. 7 is a diagram for explaining the processing of the overlap rejection unit in a step-by-step manner, wherein a transition is caused from the state 1 to the state 4 in time sequence.

The state 1 shows the state in which the first corner point data has been read. The current-processing point in the right-hand column of FIG. 7 denotes the corner point data to be held during the overlap rejection processing. The upper data and the lower data are the corner points generated on the raster boundary line during the overlap rejection processing. The output data is the result output of the overlap rejection processing, and the corner point data herein generated are sent to the subsequent bitmap calculation unit, whenever necessary. Whereas, the mark X in each cell denotes the deletion of the data concerned. Further, the data enclosed in a square denotes the data to be copied in the direction indicated by an arrow.

The corner point to be inputted first is Pa1 in accordance with the array of the corner point data list shown in FIG. 5(*b*). Pa1 is a low-start point, and hence a line l1 starting from Pa1 is supposed. The overlap number of l1 varies from the overlap number k on the lower side than Pa1 by +1 according to the definition shown in FIG. 6. The overlap number on the lower side of Pa1 is 0, and hence the overlap number of l1 is 1. The start point is stored until the end point corresponding thereto is read in the internal buffer, and becomes a current-processing point. Further, an upper data point Pu1 having the same X coordinate as that of the read corner point is generated on the upper boundary line of the current raster. At this step, the identity of the upper data point generated by the start point is set to be 5, while the identity of the point generated by the end point is set to be 6. Further, with the upper data point as the boundary, the overlap number on the lower side than it is taken over on the upper boundary line. Pu1 has an identity of 5, so that the overlap number varies from k=0 to k=1 with this point as the boundary.

The state 2 denotes the state in which the subsequent corner point data Pa2 has been read. In this state, the current processing point Pa1 is present, and hence the relational processing of the corner point Pa2 and the current processing point Pa1 is carried out. Pa2 is determined to be the end point with respect to the current processing point Pa1 from the relationship between their respective y coordinates, and the relationship between their respective identities, so that the line l1 is terminated. As a result, the current processing point Pa1 is deleted from inside the buffer. The terminated line l1 has an overlap number k=1. Further, Pu2 is generated on the upper boundary line by the corner point Pa2. The overlap number on the upper boundary line varies from k=1 to k=0 with Pu2 as the boundary. The terminated corner-point pair is determined whether it is valid or invalid according to the overlap number and the line category of the line segment therebetween. In this example, the determination of valid or invalid is defined as shown in FIG. 9. By this definition, the terminated line l1 is a lower line, and has an overlap number of k=1, and hence it is valid as the output data. Therefore, opposite corner point data (Pa1, Pa2) are outputted.

The state 3 explains the processing of the third and fourth corner points. This step is accomplished through the second raster processing. Therefore, the upper data Pu1 and Pu2 calculated in the state 2 become the initial values of the subsequent overlap number calculation as lower data (P11, P12), respectively, of the raster 2, and at the same time, the data are to be handled in the same manner as with the current processing points. Upon reading a corner point Pb1, the relational processing with the current processing points is carried out. As the current processing points, (P11, P12) are present. Both points have larger X coordinates than that of the corner point Pb1. Therefore, by new corner points (Pn1, Pn2) generated by the current processing points (P11, P12), respectively, the line starting from the corner point Pb1 is divided into line segments Pb1Pn1 and Pn1Pn2 Further, upper data (Pu2, Pu4, Pu5, Pu6) are generated on the upper boundary line of the raster for all of the read corner points, the current processing points, and the newly generated corner points. However, at each of Pu4 and Pu5, two points having the same coordinate and different identities overlap each other. In the states up to this, Pb1, Pn1, P11, and P12 are outputted, and the current processing point has been changed to Pn2. Then, upon reading a corner point Pb2, the relational processing with the current processing point Pn2 is carried out, so that the line segment Pn2Pb2 is terminated. As a result, the corner points Pn2 and Pb2 are outputted, and the upper data Pu6 is generated.

The state 4 shows the processing of the fifth to eighth corner points. At this step, the current processing points and the lower data are (P13, P14, P14, P15, P15, P16). The processing on each corner point data is carried out by repeating the respective operations described for the states up to the state 3. As a result, (Pb3, P13, Pn3, Pa3, Pa4, Pn4, Pb4, P16) are outputted.

By the processings up to this point, it is possible to provide the result obtained by extracting the pattern outermost periphery shown in FIGS. 8(*a*) and 8(*b*). Namely, as shown in FIG. 8(*a*), the pattern outermost periphery is determined so as to be Pa1 to P16 in the order shown in FIG. 8(*b*).

Herein, only the processing steps of the overlap rejection unit have been described. However, in actuality, if the output data of the overlap rejection unit is determined, whenever necessary, the data is inputted to the bitmap calculation unit, and processed therein.

By reference to FIGS. 10 to 12, the step of the bitmap calculation unit will be described. At the bitmap calculation unit, a plurality of pixels present in the row area of the matrix forming the bitmap area are collectively and parallelly processed. The area of the plurality of the pixels is herein defined as a segment. In this example, it is assumed that a segment is made up of 16 pixels. The relationship of the segments, the rasters, and the pattern is as shown in FIG. 11. The corner points (marks ○ in the figure) shown in FIG. 11 are the results of the overlap rejection. The area calculation at the bitmap calculation unit is performed in such a manner that which of addition or subtraction of the area is performed is determined by reference to the identity data of each corner point to be inputted. In this example, the relationship between the identity of each corner point and the addition/subtraction processing is set to be as shown in FIG. 12.

Figure 10:
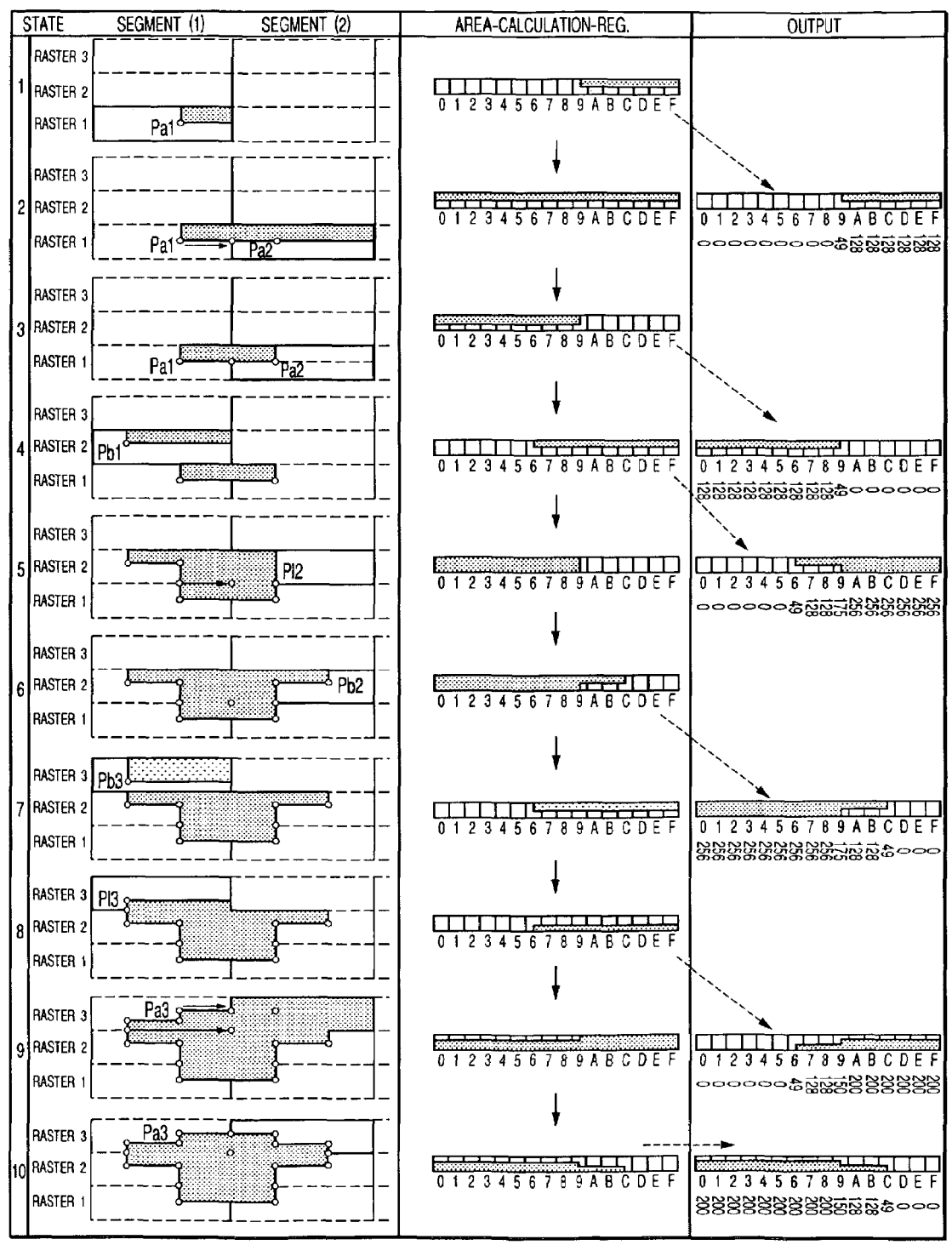
FIG. 10 is a diagram for illustrating the process of a bitmap calculation in the example of the present invention.
Figures 11, 12:
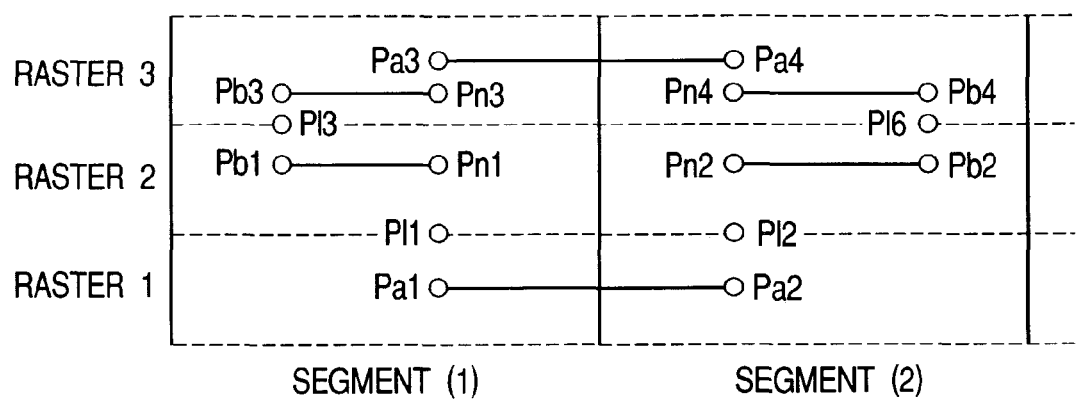
FIG. 11 is a diagram for illustrating the calculation selection rule in the example of the present invention.
FIG. 12 is a diagram for illustrating the relationship between the corner point identity and the addition or subtraction processing of the area in the example of the present invention.

FIG. 10 shows the process of the bitmap calculation. Each diagram of the left-hand side column shows how the area is formed in each state, and a transition is made from the state 1 to the state 10 in time sequence. The diagram of the middle column shows how the area is formed with respect to the pixels in the segment in each state, and the state of the area calculation register. The numbers (0 to F) show the numbers of the pixels constituting the segment. The diagram of the right-hand side column shows the result output of the bitmap calculation. In this example, the size of the pixel is set to be 16 mm square, and the area included inside the pixel is set to be calculated in unit of nm. Therefore, the calculation result is from 0 to 256. By calculating the area in smaller unit than the size of the pixel in this manner, the value of each pixel of the bitmap is made multi-level.

The state 1 shows the processing of the first corner point Pa1. The segment to which the data belongs, the pixel coordinate in the segment, and the point coordinates in the pixel are calculated from the coordinate data of the corner point. Thus, how large proportion of the pattern area generated by the corner point Pa1 is included in respective pixels is calculated. Then, the calculated value is subjected to addition or subtraction according to the calculation selection rule of FIG. 11 in the area calculation register. Further, Pa1 is stored in the internal register as the current processing point.

The state 2 shows the processing of the second corner point Pa2. Pa2 is determined to belong to a segment (2) from the coordinates. Therefore, the area calculation resister value is outputted, and the area calculation register value is cleared once. Subsequently, the extension processing of the area is performed because of the presence of the current processing point. This is the processing when the pattern lies over a plurality of segments. For this reason, Pa1 held as the current processing point is moved to the segment boundary. Then, the area element generated thereby in the segment (2) is calculated, and inputted to the area calculation register value. In this example, the area extension processing between adjacent segments is shown. However, for the area extension over not less than 3 segments, the area calculation register values resulting from the current processing points are sequentially copied to their respective segments to be extended, and outputted.

In the state 3, the area element of Pa2 is calculated, and the subtraction from the area calculation register value is performed. Further, Pa1 is terminated by. Pa2, and deleted from the current processing point list.

In the sate 4, the next corner point Pb1 is processed. Herein, switchings of segments and rasters occur, so that the area calculation register value is outputted, and the contents are cleared. Then, the area by Pb1 is calculated, and inputted to the area calculation register value.

In the states 5 and 6, the termination processing of the corner point Pb1, the area extension processing by the corner point P11, and the like are performed, so that the area calculations up to the segment (2) of the raster 2 are completed.

In the state 7, the raster and the segment are updated by the corner point Pb3. First, the area calculation value of the segment (2) of the raster 2 is outputted, and the area calculation register value is cleared. Herein, Pb3 is an upper start point, and has a corner point identity of 3. Accordingly, the calculated area element is subtracted from the area calculation register value, so that the area calculation register value is a negative value.

In the subsequent steps, process proceeds in the order of the states 8, 9, and 10, so that the bitmap values to the final raster and the final segment are outputted.

Upon being determined, the bitmap value outputted in each of the foregoing states are sent out to the buffer unit of the subsequent stage, whenever necessary. The results stored in the buffer unit are sequentially read in synchronism with exposure processing, and supplied for exposure control such as blanking control.

Figure 14:
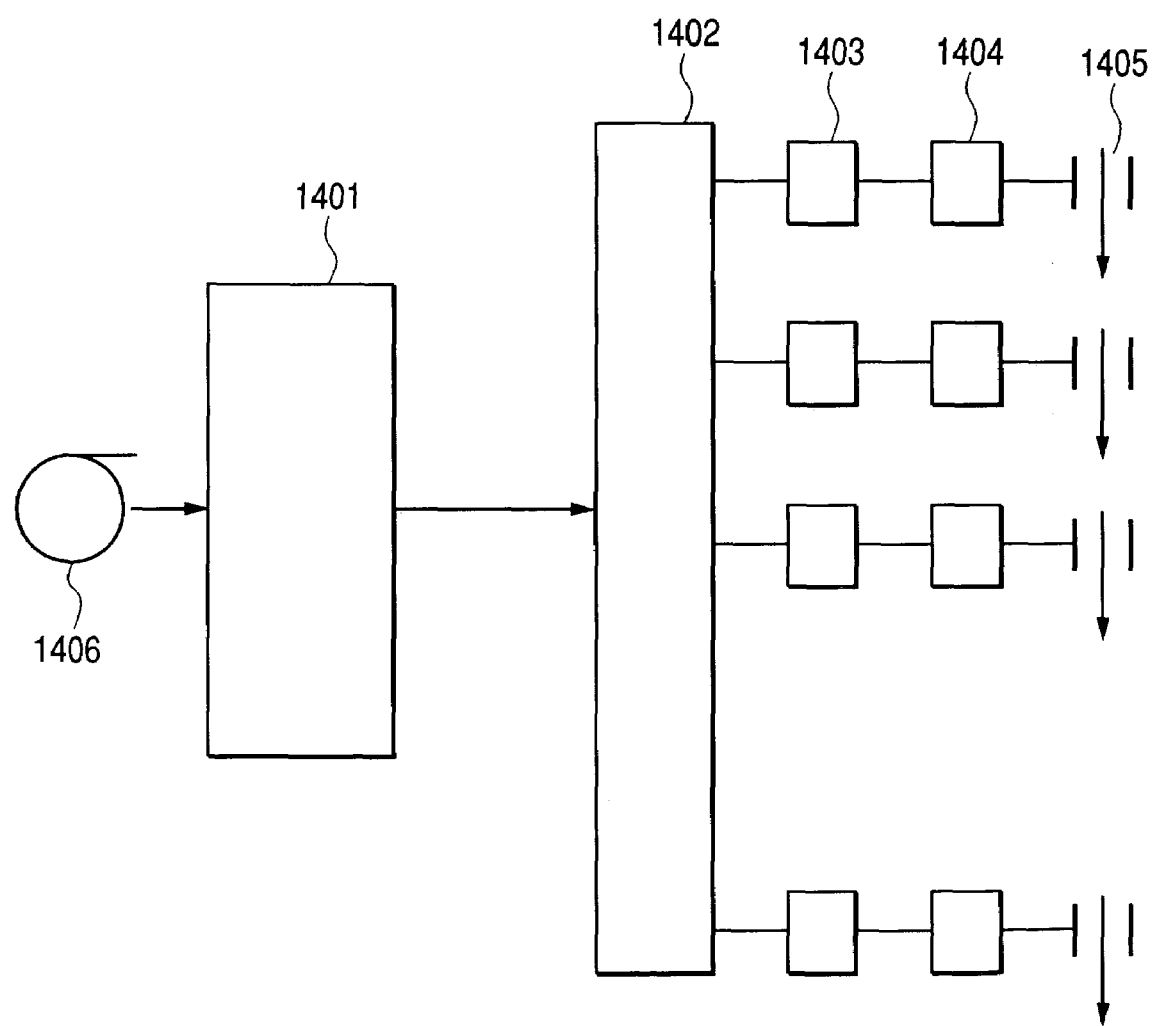
FIG. 14 is a diagram for illustrating Example 2 of the present invention.

Then, an example in which the data processing means in accordance with the present invention is applied to a charged particle beam exposure apparatus having a plurality of charged particle beams will be described by reference to FIG. 14. A plurality of the charged beams simultaneously expose different areas on a sample. Therefore, a large amount of data is required at the same time.

In this example, independent data processing means of the present invention are provided, one for each area to be covered by each charged particle beam, so that respective means parallelly process data. For the data processing means of the present invention, the handling data is small in amount, which allows the reduction in size thereof. Therefore, it is possible to dispose a large number of the data processing means in parallel to each other as in this example. The data 1406 of the pattern to be exposed is divided into data for respective areas to be exposed to their corresponding charged beams 1405, and supplied to their respective data processing means 1403 by functions 1401 and 1402 of totalizing and controlling a plurality of the data processing units. Each data processing means 1403 performs the foregoing processing, and supplies the data to its corresponding beam control unit 1404.

Figure 15A:
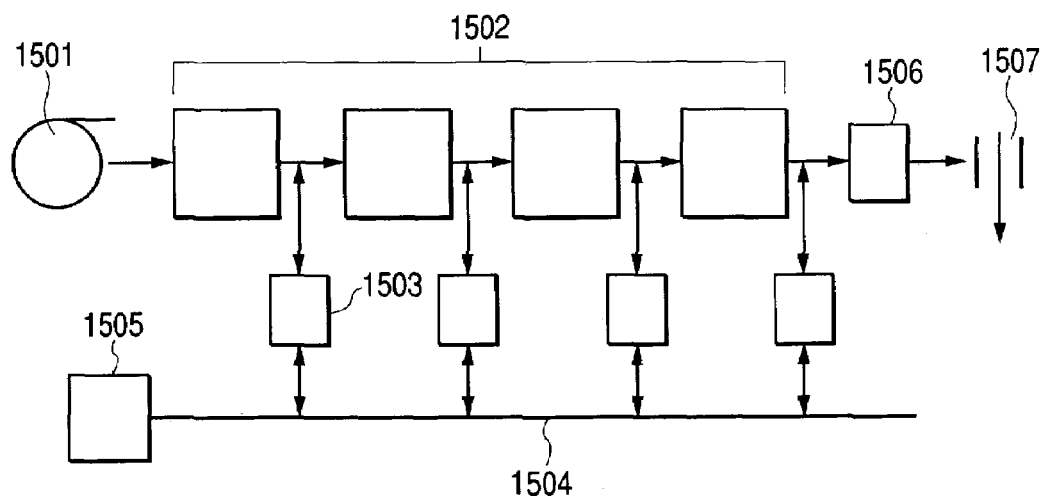
FIGS. 15(a) and 15(b) are diagrams for illustrating Example 3 of the present invention.
Figure 15B:
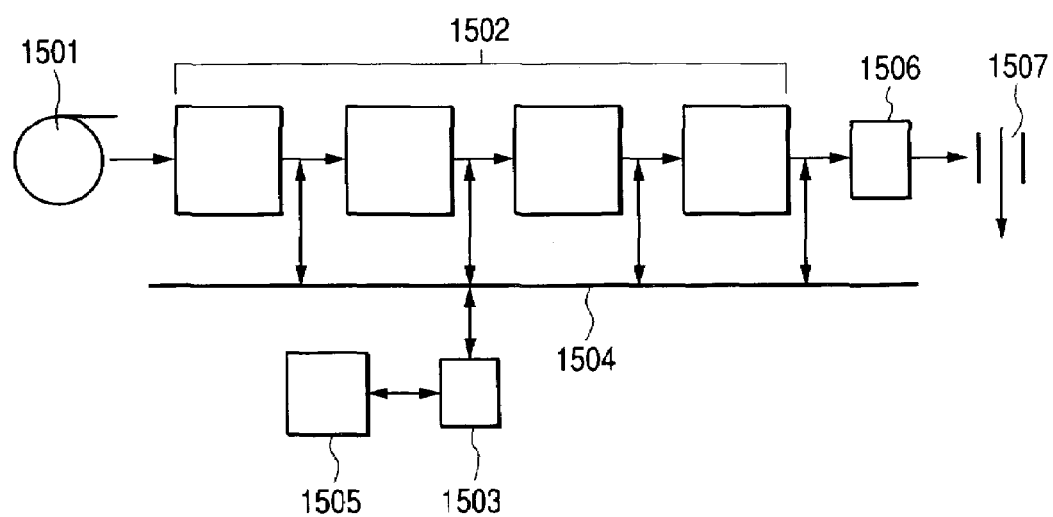

Then, FIGS. 15(*a*) and 15(*b*) show an example in which a memory means is added for selectively holding the data processed by the data processing means in accordance with the present invention. The data held thereby are used for the purpose of checking the function of the system, for example, for being checked with the exposure result. The held data will not be used for exposure, and hence the compressed format can be adopted, which will not cause the increase in memory capacity.

FIG. 15(*a*) shows the configuration in which memory means 1503 are added one to each calculation element constituting the data processing means 1502. It is so configured that the data transfer between the respective memory means 1503 and a control computer 1505 is allowed through a data bus 1504.

Whereas, FIG. 15(*b*) shows the configuration in which data buses 1504 are added one to each calculation element constituting the data processing means 1502, and a memory means 1503 is connected thereto. The data transfer is allowed between the memory means 1503 and the control computer 1505. Further, in the respective examples, it is possible to write data to the memory means added to the data processing means from the control computer 1505. This allows the ideal data free from errors in calculation processing to be stored in the memory means 1503.

Herein, to each calculation element constituting the data processing means 1502 of this example, a function capable of selectively setting the path of data has been added. As a result, it is possible to perform calculation processing using the ideal data stored in the memory means 1503, and to perform the operation check of the respective calculation elements constituting the data processing means 1502. Further, it is also possible to add a data comparison function to the memory means 1503 of this example. As a result, it becomes possible to perform comparison with the previously held ideal data, and it is possible to perform the operation check of the respective calculation elements constituting the data processing means 1502.

Then, a description will be given to an example in which the data processing means in accordance with the present invention is applied to the comparison test apparatus. The exposure apparatus and the comparison test apparatus are not largely different from each other in function of generating pattern data in the bitmap format from the pattern designed data. Therefore, also with the comparison test apparatus for performing comparison test of the shape of the LSI pattern or the like obtainable through the application of charged beams or light onto a sample using the pattern shape data in the bitmap format, it is possible to generate one data out of the two data to be compared therebetween, i.e., the pattern data in the bitmap format generated from the pattern designed data by the data processing means of the present invention.

FIG. 16 shows an example of a comparison test apparatus provided with a bitmap pattern generator including therein the data processing means in accordance with the present invention. The comparison test apparatu's of this example is composed of a control computer 1602, a control data bus 1603, an input memory 1604, a bitmap pattern generator 1605, a comparator 1606, a defect identification apparatus 1607, an output memory 1608, and an image input apparatus 1609. Further, as an example of the image input apparatus 1609, herein, mention is made of an apparatus using a charged beam. The image input apparatus 1609 is composed of a charged beam source 1612, a lens deflection system 1614, a sample stage 1616, a charged particle detector 1617, a lens deflection controller 1610, a sample stage controller 1611, and a signal processor 1618. Although there are also other components, the ones not directly relevant to the present invention are omitted.

An object of the comparison test apparatus of this example is to test whether the shape of the pattern formed on a sample 1615 agrees with the designed pattern data 1601 or not based on the designed pattern data 1601. To this end, this comparison test apparatus receives the designed pattern data 1601 used for the pattern formation on the sample 1615 through the control computer 1602. A part of, or the whole of the inputted designed pattern data 1601 are transferred to the input memory 1604.

On the other hand, in the image input apparatus, the sample 1615 having the pattern formed by the designed pattern data 1601 is mounted on the sample stage 1616. Based on a command from the control computer 1602, the bitmap pattern generator 1605 generates data in the bitmap format corresponding to the designed pattern data 1601, and starts transmission to the comparator. Herein, the data processing means of the present invention are provided inside the bitmap pattern generator 1605, which enables high speed generation of bitmap data.

Almost simultaneously therewith, at the image input apparatus 1609, application of the charged beam 1613 onto the sample 1615 and scanning of the charged beam 1613 by the lens deflection controller 1610 are started. As a result, charged particles from the sample 1615 are made incident upon the charged beam detector 1617, so that it is possible to obtain data on the pattern shape formed on the sample 1615. This is transmitted to the comparator through the signal processor 1618. In the comparator, the data in the bitmap format and the data on the pattern shape on the sample 1615 have been inputted, and hence both the data are compared with each other. The comparison result between both the data is inputted to the defect identification apparatus 1607, and the presence or absence of defects, kind, and the like are identified. The results are outputted to the output memory. The data stored in the output memory are subjected to display, analysis, and other processings at the control computer. With the foregoing configuration and operations, it is possible to perform the test of defects and the like at a high speed.

Figure 17:
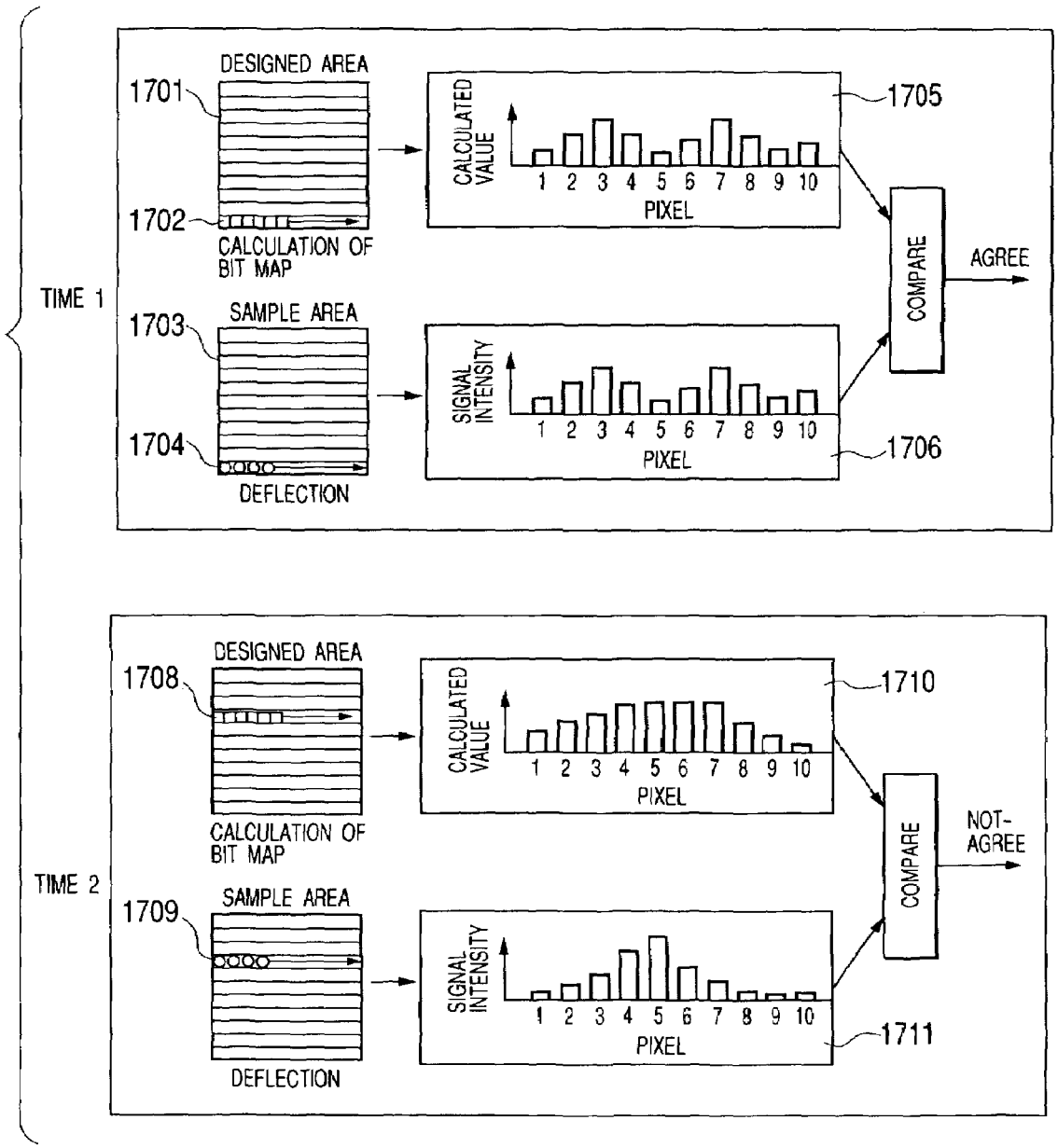
FIG. 17 is a diagram for illustrating a comparison test method of the comparison test apparatus shown in FIG. 16.
Figure 18:
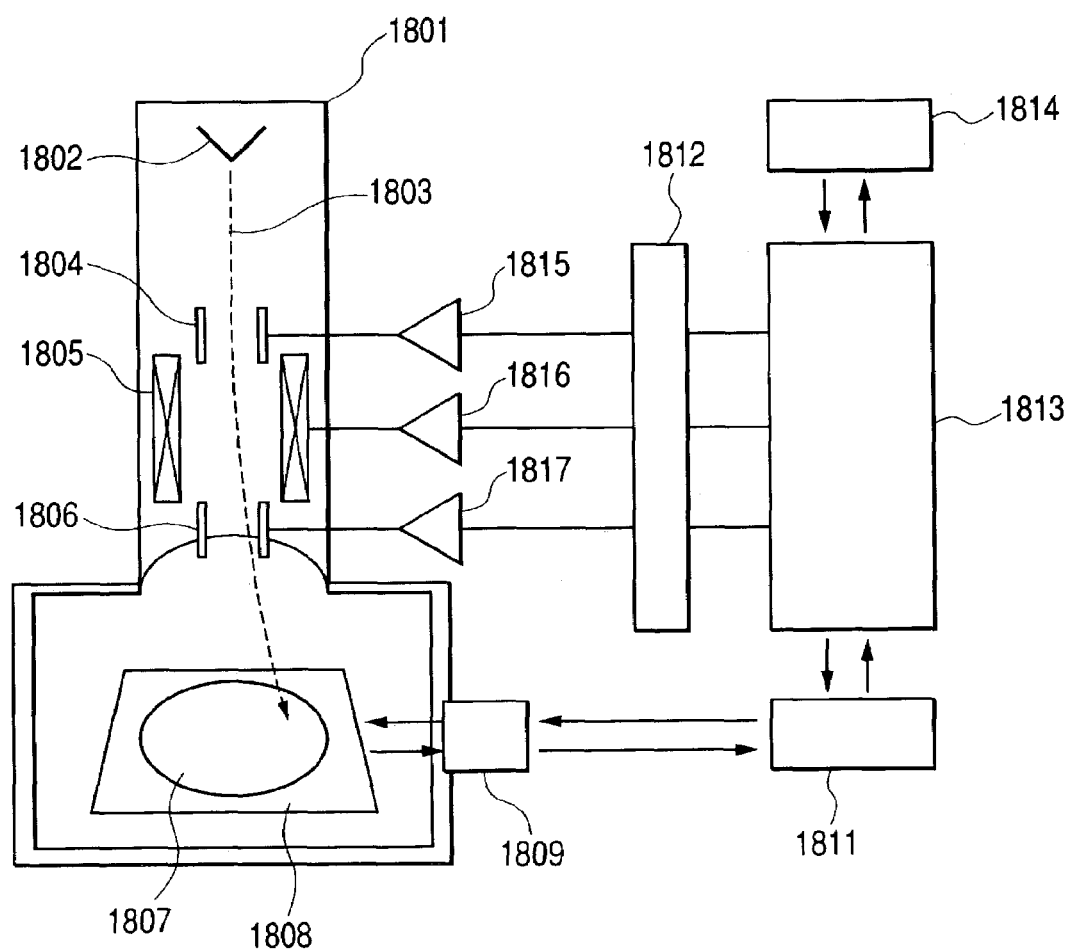
FIG. 18 is a diagram for showing a general configuration of a charged particle beam exposure apparatus.

FIG. 17 shows one example of the comparison test method by means of this comparison test apparatus.

At time 1, an area 1702 in a data designed area 1701 is subjected to bitmap calculation by the data processing means of the present invention. On the other hand, a charged beam is deflection controlled on an area 1704 of a sample area 1703 corresponding to the area 1702 in the data designed area 1701. At this step, the areas of the pixels for bitmap calculation and the pixels obtained by deflection control agree with each other. As a result, the calculated result 1705 and the detection result 1706 are obtained. The comparison between both the results reveals the difference therebetween.

Time proceeds to the time 2, at which the calculation area is changed to 1708, and the deflection control area is changed to 1709. At this step, the calculated result is the calculation result 1710, and the detection result is the detection result 1711. It is indicated that the results do not agree with each other in such a case. Thus, if the comparison test is performed using the data processing means of the present invention, it is possible to obtain bitmap data at a high speed, and hence it is possible to increase the speed of the comparison test. Further, it is also acceptable that the image input apparatus is not the one using charged beams as in this example. It is apparent that the apparatus using light is also applicable.

As described above, for the data processing in accordance with the present invention, it is so configured that the bitmap data of the portion to be exposed or tested are sequentially generated for exposure or comparison in real time. As a result, the amount of data to be handled inside the data processor is largely reduced, which enables the increase in speed of the processing and the reduction in circuit-scale. Further, it is possible to make the pixel data multi-level, and to achieve higher resolution so that fine size resolution can be obtained by the pixel size larger than it.

Further, in the foregoing example, the charged beam exposure apparatus which is one kind of the exposure apparatuses has been described as an example. However, the data processing means in accordance with the present invention is also applicable to an exposure apparatus using light because only the medium of energy for performing exposure is different.

Still further, as described above, also with the comparison test apparatus for comparing and testing the shape of the LSI pattern or the like, obtainable through the application of charged beams or light on the sample using the pattern shape data in the bitmap format, it is possible to generate one data out of the two data to be compared, i.e., the pattern data in the bitmap format generated from the pattern designed data by means of the data processing means of the present invention.

The present invention includes the following configuration examples:

(1) An exposure apparatus for controlling the application of a charged beam or a light onto a sample using pattern shape data in a bitmap format, characterized by including a data processing means having a function of rejecting an overlap area between patterns from pattern vertex data defining the pattern shape; and a function of generating the pattern shape data in the bitmap format based on the result of the overlap rejection function.

(2) The exposure apparatus according to the foregoing item (1), characterized in that the data processing means for generating the pattern shape data in the bitmap format operates simultaneously with the exposure operation due to the application of a charged beam or a light onto the sample.

(3) The exposure apparatus according to the foregoing item (1), characterized in that the data processing means has a data format for expressing the pattern shape by a pair of opposite corner point coordinates of each line parallel to any one coordinate axis of the orthogonal coordinates.

(4) The exposure apparatus according to the foregoing item (1), characterized in that the data processing means has a function of decomposing the received pattern shape into a plurality of rectangle patterns parallel to any one coordinate axis of the orthogonal axes defined on the sample, and converting each of the rectangle patterns into the data format for expressing the pattern shape by a pair of opposite corner point coordinates of each line parallel to any one coordinate axis of the orthogonal coordinates defined on the sample on the previous stage of the overlap rejection function.

(5) The exposure apparatus according to the foregoing item (1), characterized in that the data processing means has a function of grouping corner point data representing the respective patterns on a per given coordinate area basis, and sorting the respective grouped corner point data by reference to the coordinates of the respective corner point data on the previous stage of the overlap rejection function.

(6) The exposure apparatus according to the foregoing item (5), characterized in that the coordinate area for grouping the respective corner point data is an area corresponding to an array of pixels arranged adjacent to each other in a direction parallel to any one coordinate axis of the orthogonal coordinates defined on the sample out of pixel arrays of the bitmap.

(7) The exposure apparatus according to the foregoing item (4), characterized in that the line formed by the pair of the corner points representing the pattern and the direction of the bitmap pixel array for grouping the corner point data are parallel to each other.

(8) The exposure apparatus according to the foregoing item (7), characterized in that the direction of the bitmap pixel array for grouping the corner point data and the direction of scanning of the charged beam or light are parallel to each other.

(9) The exposure apparatus according to the foregoing item (4), characterized in that, out of the respective corner points of the corner point pair, one is set to be a start point and the other is set to be an end point according to the magnitude of the coordinate data with respect to the coordinate axis parallel to each line formed thereby, so that identity data for performing the identification thereof is appended to each corner point coordinate data.

(10) The exposure apparatus according to the foregoing item (9), characterized in that, in each pattern to which the lines belong, one is set to be an upper line, and the other is set to be a lower line according to the magnitude of the coordinate data of each line with respect to its orthogonal coordinate axis, so that identity data for performing the identification thereof is appended to each corner point coordinate data.

(11) The exposure apparatus according to the foregoing item (10), characterized in that the overlap rejection processing has a function of sequentially reading and receiving the sorted corner point data one by one, a function of determining the identity data of the received corner point, a function of storing and holding the corner point data based on the determination result of the identity data, a function of calculating the relationship between the received corner point data and the corner point data stored and held prior to the receipt of the corner point data, and a function of determining whether the corner point data represent the corner points forming the lines corresponding to the outermost periphery of the pattern.

(12) The exposure apparatus according to the foregoing item (11), characterized in that a variable for showing the state of overlap between the lines formed by the corner point data is appended to each of the corner point data sequentially read one by one to the overlap rejection function.

(13) The exposure apparatus according to the foregoing item (11), characterized in that the calculation to be performed according to the determination result of the identity data is addition or subtraction of the variable for showing the overlap state according to the positional relationship with the stored and held corner point data.

(14) The exposure apparatus according to the foregoing item (11), characterized in that the function of storing and holding the corner point data is performed when the identity data of the corner point is a start point of the line formed by the corner point.

(15) The exposure apparatus according to the foregoing item (11), characterized in that the function of determining whether the corner point data represent the corner points forming the lines corresponding to the outermost periphery of the pattern is performed upon determining the combinations of the identity data of the corner point and the variable for showing the state of overlap between the lines formed by the corner points.

(16) The exposure apparatus according to the foregoing item (15), characterized in that the corner point data pairs determined to be the corner points forming the lines corresponding to the outermost periphery of the pattern by the function of determining whether the corner point data represent the corner points forming the lines corresponding to the outermost periphery of the pattern are sequentially outputted to the function of generating the pattern shape data in the bitmap format.

(17) The exposure apparatus according to the foregoing item (16), characterized in that the function of generating pattern data in a bitmap format from the corner point data representing the outermost periphery of the pattern has a function of sequentially receiving the corner point data one by one, calculating the area of a rectangle generated in a region including the corner point data as vertexes, and for grouping the corner points, or in a part of the region, and sequentially performing summation on a per the bitmap-constituting pixel basis.

(18) The exposure apparatus according to the foregoing item (17), characterized in that the function of performing summation of the areas of the rectangle calculated on a per the sequentially received corner point data basis has a function of determining the identity data of the received corner point, and determining the sign for area summation of the rectangle.

(19) The exposure apparatus according to the foregoing item (18), characterized in that the summation of the areas of the rectangle is performed on all the corner point data present within the range of the area for grouping the corner point data or within a partial region thereof, and has a function of, at the instant when the corner point data having coordinates outside the region is inputted, outputting the value summed up until the instant.

(20) The exposure apparatus according to the foregoing item (19), characterized in that in the function of performing summation of the rectangle areas on a per the sequentially received corner point data basis, the calculation of the area is performed in smaller unit than with the size of the pixels constituting the bitmap.

(21) The exposure apparatus according to the foregoing items (1) to (20), characterized by including a storage means for selecting and holding the respective data processing processes.

(22) The exposure apparatus according to the foregoing item (21), characterized in that the storage means for selecting and holding the respective data processing processes has a function of writing data through a different path from the respective data processing processes, and a function of performing data processing using the written data.

(23) The exposure apparatus according to the foregoing item (22), characterized by including a means for comparing the data previously written and held in the storage means for selecting and holding the respective data processing processes with the data inputted from the respective data processing processes.

(24) The exposure apparatus according to the foregoing items (1) to (23), characterized in that the pattern shape data in the bitmap format are decomposed, and the respective controls of applications of a plurality of charged beams or light rays are performed.

(25) A comparison test apparatus for comparing and testing the data representing the pattern shape formed on a sample obtainable through application of light or a charged beam on the sample, and the pattern shape data in a bitmap format, characterized by including: a function of rejecting an overlap area between patterns from the pattern vertex data defining the pattern shape; and a function of generating pattern shape data in a bitmap format based on the result of the overlap rejection function.

(26) The comparison test apparatus according to the foregoing item (25), characterized in that the application of light or a charged beam on the sample is performed simultaneously with the generation of the pattern shape data in a bitmap format of the data processing means.

In accordance with the present invention, it is possible to provide an exposure technology capable of generating bitmap data with high efficiency, and making compatible higher resolution and higher speed control with an exposure apparatus using pattern data in a bitmap format.

What is claimed is:

1. An exposure apparatus, comprising: a means for applying a charged particle beam or a light onto a sample, and exposing a desired pattern onto the sample; a data processing means for bitmapping the shape of the pattern, and generating the pattern shape data in the bitmap format; and a means for controlling the application of the charged beam or light onto the sample using the pattern shape data in the bitmap format; wherein the data processing means comprises a function of rasterizing a pattern vertex data defining the pattern shape by a unit of a respective row area of the bitmap, a function of rejecting an overlap area between patterns, and a function of generating the pattern shape data in the bitmap format by the unit of a respective row area of the bitmap in a parallel pipeline manner, based on the result of the overlap rejection function.

2. The exposure apparatus according to claim 1, wherein the data processing means has a data format for expressing the pattern shape by a pair of opposite corner point coordinates of each line parallel to any one coordinate axis of orthogonal coordinates defined on the sample.

3. An exposure apparatus, comprising: a means for applying a charged particle beam or a light onto a sample, and exposing a desired pattern onto the sample; a data processing means for bitmapping the shape of the pattern, and generating the pattern shape data in the bitmap format; and a means for controlling the application of the charged particle beam or light onto the sample using the pattern shape data in the bitmap format; wherein the data processing means comprises a function of decomposing the pattern shape into a plurality of rectangle patterns parallel to any one coordinate axis of orthogonal coordinates defined on the sample, converting the pattern shape into a data format for expressing the pattern shape as a pair of opposite corner point coordinates of each line parallel to any one coordinate axis of the orthogonal coordinates defined on the sample, a function of rejecting an overlap area between patterns from the respective sorted corner point data, and a function of generating the pattern shape data in the bitmap format by a unit of one of the plurality of rectangle patterns in a parallel pipeline manner, based on the result of the overlap rejection function.

4. The exposure apparatus according to claim 3, wherein the coordinate area for grouping the respective corner point data is an area corresponding to an array of pixels arranged adjacent to each other in a direction parallel to any one coordinate axis of the orthogonal coordinates defined on the sample out of pixel arrays of the bitmap.

5. The exposure apparatus according to claim 3, wherein the line formed by the pair of the corner points representing the pattern and the direction of a bitmap pixel array for grouping the corner point data are parallel to each other, and the direction of the bitmap pixel array for grouping the corner point data and the direction of scanning of the charged beam or light are parallel to each other.

6. The exposure apparatus according to claim 3, wherein, out of the respective corner points of the corner point pair, one is set to be a start point and the other is set to be an end point according to the magnitude of the coordinate data with respect to the coordinate axis parallel to the line formed thereby, so that identity data for identifying the start point or the end point is appended to each corner point coordinate data, and in each pattern to which the lines belong, one is set to be an upper line, and the other is set to be a lower line according to the magnitude of the coordinate data of the respective lines with respect to their orthogonal coordinate axis, so that identity data for identifying the upper line or the lower line is appended to each corner point coordinate data.

7. The exposure apparatus according to claim 6, wherein the overlap rejection processing has a function of sequentially reading and receiving the sorted corner point data one by one, a function of determining the identity data of the received corner point, a function of storing and holding the corner point data based on the determination result of the identity data, a function of calculating the relationship between the received corner point data and the corner point data stored and held prior to the receipt of the corner point data, and a function of determining whether the corner point data represent the corner points forming the lines corresponding to the outermost periphery of the pattern.

8. The exposure apparatus according to claim 7, wherein the corner point data pairs determined to be the corner points forming the lines corresponding to the outermost periphery of the pattern by the function of determining whether the corner point data represent the corner points forming the lines corresponding to the outermost periphery of the pattern are sequentially outputted to the function of generating the pattern shape data in the bitmap format, and the function of generating pattern data in a bitmap format from the corner point data representing the outermost periphery of the pattern has a function of sequentially receiving the corner point data one by one, calculating the area of a rectangle generated in a region including the corner point data as vertexes, and for grouping the corner points, or in a part of the region, and sequentially performing summation on a per the bitmap-constituting pixel basis.

9. The exposure apparatus according to claim 8, wherein the function of performing summation of the areas of the rectangle calculated on a per the sequentially received corner point data basis has a function of determining the identity data of the received corner point, and determining the sign for area summation of the rectangle.

10. The exposure apparatus according to claim 3, configured for dividing the pattern shape data in the bitmap format, and controlling the applications of a plurality of charged particle beams or light rays thereon.

11. An exposure method, comprising the steps of:
applying a charged particle beam or a light on a sample while controlling the application using pattern shape data in a bitmap format, and exposing a desired pattern onto the sample;
decomposing the pattern shape into a plurality of rectangle patterns parallel to any one coordinate axis of the orthogonal axes defined on the sample, and converting each rectangle pattern into the data format for expressing the pattern shape by a pair of opposite corner point coordinates of each line parallel to any one coordinate axis of the orthogonal coordinates defined on the sample;
grouping corner point data representing the respective rectangle patterns on a per given coordinate area basis, and sorting the respective grouped corner point data by reference to the coordinates of the respective corner point data; and
rejecting an overlap area between patterns from the respective sorted corner point data;
wherein:
the pattern shape data in the bitmap format is generated based on the result of the overlap rejection step,
out of the respective corner points of each corner point pair, one is set to be a start point and the other is set to be an end point according to the magnitude of the coordinate data with respect to a coordinate axis parallel to the line formed thereby, so that identity data for identifying the start point or the end point is appended to each corner point coordinate data, and
in each pattern to which the lines belong, one is set to be an upper line, and the other is set to be a lower line according to the magnitude of the coordinate data of the respective lines with respect to their orthogonal coordinate axis, so that identity data for identifying the upper line or the lower line is appended to each corner point coordinate data.

12. The exposure method according to claim 11, wherein the overlap rejection processing comprises the steps of:
sequentially reading and receiving the sorted corner point data one by one; determining the identity data of the received corner point; storing and holding the corner point data based on the determination result of the identity data; calculating the relationship between the received corner point data and the corner point data stored and held prior to the receipt of the corner point data, and determining whether the corner point data represent the corner points forming the lines corresponding to the outermost periphery of the pattern.

* * * * *